(12) United States Patent
Mendenhall et al.

(10) Patent No.: US 11,005,427 B2
(45) Date of Patent: May 11, 2021

(54) AUDIBLE NOISE REDUCTION IN AN AUDIO POWER AMPLIFIER

(71) Applicant: RGB Systems, Inc., Anaheim, CA (US)

(72) Inventors: Eric Mendenhall, Trabuco Canyon, CA (US); Robert Cesar Muniz, Douglas, MA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 16/549,973

(22) Filed: Aug. 23, 2019

(65) Prior Publication Data

US 2020/0067461 A1 Feb. 27, 2020

Related U.S. Application Data

(60) Provisional application No. 62/723,323, filed on Aug. 27, 2018.

(51) Int. Cl.
| | |
|---|---|
| *H03F 3/38* | (2006.01) |
| *H03F 1/26* | (2006.01) |
| *H03F 3/45* | (2006.01) |
| *H03F 3/217* | (2006.01) |

(52) U.S. Cl.
CPC ............ *H03F 1/26* (2013.01); *H03F 3/2171* (2013.01); *H03F 3/45071* (2013.01); *H03F 2200/03* (2013.01); *H03F 2200/135* (2013.01); *H03F 2200/156* (2013.01); *H03F 2200/171* (2013.01); *H03F 2200/234* (2013.01); *H03F 2200/351* (2013.01); *H03F 2203/45116* (2013.01); *H03F 2203/45528* (2013.01); *H03F 2203/45536* (2013.01)

(58) Field of Classification Search
CPC .................................. H03F 3/38; H03F 3/217

USPC ........................................ 330/10, 207 A, 251
See application file for complete search history.

(56) References Cited

U.S. PATENT DOCUMENTS

| | | | | |
|---|---|---|---|---|
| 7,414,471 | B2* | 8/2008 | Krishnan | ................. H03F 1/34 |
| | | | | 330/207 A |
| 9,231,535 | B2* | 1/2016 | Du | ....................... H03F 3/2175 |
| 2007/0139109 | A1 | 6/2007 | Honda et al. | |
| 2008/0024216 | A1 | 1/2008 | Wang | |
| 2013/0057238 | A1 | 3/2013 | Fang et al. | |

(Continued)

FOREIGN PATENT DOCUMENTS

WO       WO 2011-064787         6/2011

OTHER PUBLICATIONS

Extended European Search Report dated Jan. 24, 2020 for European Patent Application No. 19193502.2 filed Aug. 25, 2019. 13 pages.

*Primary Examiner* — Henry Choe
(74) *Attorney, Agent, or Firm* — Knobbe, Martens, Olson & Bear, LLP (57) ABSTRACT

Aspects disclosed herein eliminate audible disturbances that may occur when an audio amplifier is activated and deactivated. A feedback circuit is used to maintain a closed loop when transistors of a power output stage are activate or deactivated, thereby enabling the charge to build or dissipate without causing an audible disturbance. Further, in certain implementations, the power output stage may remain in an enable state for a period of time after deactivation of the audio amplifier regardless of whether an audio input signal is received enabling dissipation of charge without causing an audible disturbance.

20 Claims, 11 Drawing Sheets

(56) References Cited

U.S. PATENT DOCUMENTS

2014/0062592 A1 3/2014 Chang et al.
2016/0211809 A1 7/2016 Chang et al.

* cited by examiner

AUDIBLE NOISE REDUCTION IN AN AUDIO POWER AMPLIFIER

INCORPORATION BY REFERENCE TO ANY PRIORITY APPLICATIONS

This application claims priority to U.S. Provisional Application No. 62/723,323, filed on Aug. 27, 2018 and titled "AUDIBLE NOISE REDUCTION IN AN AUDIO POWER AMPLIFIER," and which is hereby incorporated by reference in its entirety herein. Any and all applications, if any, for which a foreign or domestic priority claim is identified in the Application Data Sheet of the present application are hereby incorporated by reference in their entireties under 37 CFR 1.57.

FIELD OF THE DISCLOSURE

The present disclosure relates to audio amplifier. More specifically, the present disclosure relates to noise reduction in an audio amplifier.

BACKGROUND

Audio amplifiers are often used to amplify an audio signal before providing the audio amplifier to a speaker. When an audio amplifier is turned on, power is supplied to the elements of the audio amplifier. These elements may include various capacitors and inductors that may collect a charge. Similarly, when the audio amplifier is turned off, the charge from the capacitors and inductors may dissipate. Often times, the charging and dissipating of power from elements of the audio amplifier causes audible noise that may be unpleasant to a listener.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects disclosed herein relate to an audio amplifier. The audio amplifier may include a power output stage comprising a pair of transistor switches, the power output stage configured to amplify a pulse width modulation signal; a low pass filter configured to filter a carrier signal from the amplified pulse width modulation signal; a pulse width modulation circuit configured to generate the pulse width modulation signal, wherein the pulse width modulation signal corresponds to an audio input signal; and a feedback path including an impedance connected between the pulse width modulation circuit and a control circuit of the audio amplifier.

In some implementations, the feedback path further includes a switch that is closed when the power output stage is inactive and open when the power output stage is active. Further, the audio amplifier may further include the control circuit. The control circuit may be configured to provide the audio input signal to the pulse width modulation circuit. Further, the control circuit may comprise an integrating capacitor. Further, the feedback path may be further configured to establish a first state of the integrating capacitor when the power output stage is inactive and a second state of the integrating capacitor when the power output stage is active. In some cases, the first state matches or substantially matches to a threshold degree the second state.

In some aspects, the control circuit comprises a first operational amplifier configured to receive a feedback signal from an output of the audio amplifier at an inverting input of the first operational amplifier. Further, the control circuit may comprise a second operational amplifier configured to receive a feedback signal from an output of the power output stage at an inverting input of the second operational amplifier. In some cases, the power output stage is configured to remain active for at least a non-zero period of time after a supply voltage ceases to provide a voltage to the power output stage. For example, the power output stage may remain active for 50 ms, 100 ms, or a second, or any other length of time sufficient for the power to dissipate, thereby reducing or eliminating audible disturbances from the audio amplifier. Further, the pulse width modulation circuit may comprise a comparator and a triangle generator, the comparator configured to compare an output of the control circuit to an output of the triangle generator. The audio amplifier may further include an inverting compensation circuit between a first operational amplifier of the control circuit and a second operational amplifier of the control circuit. In some cases, the pulse width modulation signal is generated based at least in part on the audio input signal.

Certain additional aspects of the present disclosure relate to an audio amplifier system. The audio amplifier system may include a power supply and an audio amplifier. The power supply may be configured to power one or more elements of the audio amplifier system, such as the audio amplifier, or one or more operational amplifiers or transistors of the audio amplifier. The audio amplifier may be configured to receive power from the power supply and an audio input signal from an audio source, such as a radio, computer, wireless device, microphone, or other device that may provide audio to an audio amplifier. The audio amplifier may comprise: a power output stage comprising a pair of transistor switches, the power output stage configured to amplify a pulse width modulation signal; a low pass filter configured to filter a carrier signal from the amplified pulse width modulation signal; a pulse width modulation circuit configured to generate the pulse width modulation signal, wherein the pulse width modulation signal corresponds to the audio input signal; and a feedback path including an impedance connected between the pulse width modulation circuit and a control circuit of the audio amplifier.

In some implementations, the audio amplifier further comprises a switch configured to remove the feedback path when the power output stage is enabled. Further, the control circuit may comprise an integrating capacitor. Moreover, the feedback path may be further configured to cause the integrating capacitor to enter a first state when the power output stage is inactive and to enter a second state when the power output is active. In some cases, the first state and the second state are substantially equal.

The control circuit, in some aspects, may comprise a first operational amplifier configured to receive a feedback signal from an output of the audio amplifier at an inverting input of the first operational amplifier; and a second operational amplifier configured to receive a feedback signal from an output of the power output stage at an inverting input of the second operational amplifier. Further, the power output stage may be configured to remain active for a particular time period after a supply voltage ceases to provide a voltage to the power output stage. For example, the power output stage may be active or enabled for 100 ns, 50 ms, 150 ms, or any other period of time that enables power to dissipate thereby preventing or reducing an audible noise or disturbance from a change of operational state of the audio amplifier. In some cases, the power output stage may be enabled for a particular period of time prior to the audio amplifier being ready to process an audio input signal. For example, the power output stage may receive an enable signal upon turning on the audio amplifier and/or for a period of 100 ns, 50 ms, 150 ms, or any other period of time that enables components (e.g., capacitors or inductors) to build a charge sufficiently close to an operating voltage to prevent or reduce an audible noise or disturbance from a change of operational state of the audio amplifier. In some implementations, the audio amplifier further comprises an inverting compensation circuit between a first operational amplifier of the control circuit and a second operational amplifier of the control circuit.

BRIEF DESCRIPTION OF THE DRAWINGS

Throughout the drawings, reference numbers are re-used to indicate correspondence between referenced elements. The drawings are provided to illustrate certain aspects of the subject matter described herein and not to limit the scope thereof.

DETAILED DESCRIPTION

Certain types of amplifiers may be used to amplify an audio signal. The amplifiers used to amplify an audio signal may be referred to as an audio amplifier. The amplified audio signal output by the audio amplifier may be provided to a speaker for output as audio. There are different types of amplifiers that may be used as an audio amplifier. One example of an amplifier that may be used as an audio amplifier is a class D amplifier. A class D amplifier includes transistors used to switch between different rail voltages and is typically not a linear gain device. The switches of the class D amplifier may be switched rapidly between the supply rails +Vrail and −Vrail. Advantageously, in certain implementations, the class D amplifier can be more efficient than a linear amplifier. The class D amplifier may be imple-mented using field-effect transistors (FETs), such as metal-oxide-semiconductor field-effect transistors (MOSFETs).

Figure 1A:
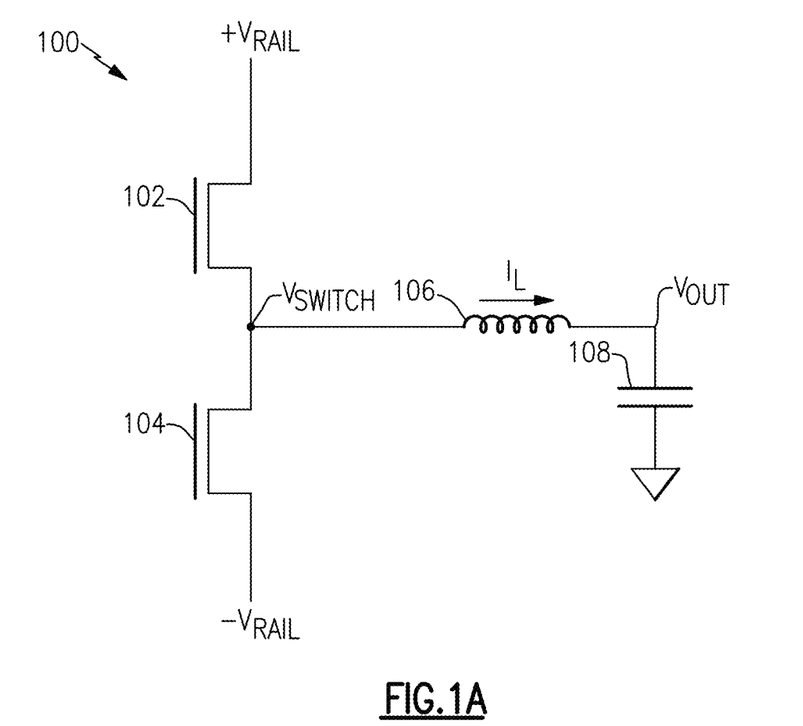
FIG. 1A illustrates a simplified circuit diagram of an output stage of an example class D amplifier.

FIG. 1A illustrates a simplified circuit diagram of a portion of an example class D amplifier 100. The illustrated portion of the class D amplifier 100 includes an output stage implemented by a pair of transistors and an output LC filter. A number of additional elements may form part of the class D amplifier. These additional elements are omitted to simplify discussion and not to limit the present disclosure. The amplifier 100 may include a pair of switches 102 and 104 implemented by transistors. The switch 102 may be connected to +Vrail and the switch 104 may be connected to −Vrail. Further, the switches 102 and 104 may alternative between on and off states with one switch being on while the other switch if off. Thus, when the switches are active, the output or switch voltage Vswitch, may alternate between +Vrail and −Vrail.

Further, the amplifier 100 may include a filter, such as an LC filter that includes an inductor 106 and a capacitor 108. When the amplifier 100 is active, a current may flow through the inductor 106 charging the inductor 106 and, in some cases, the capacitor 108. An output signal may appear at the node Vout, which can be provided to a subsequent system, such as a speaker system.

Figure 1B:
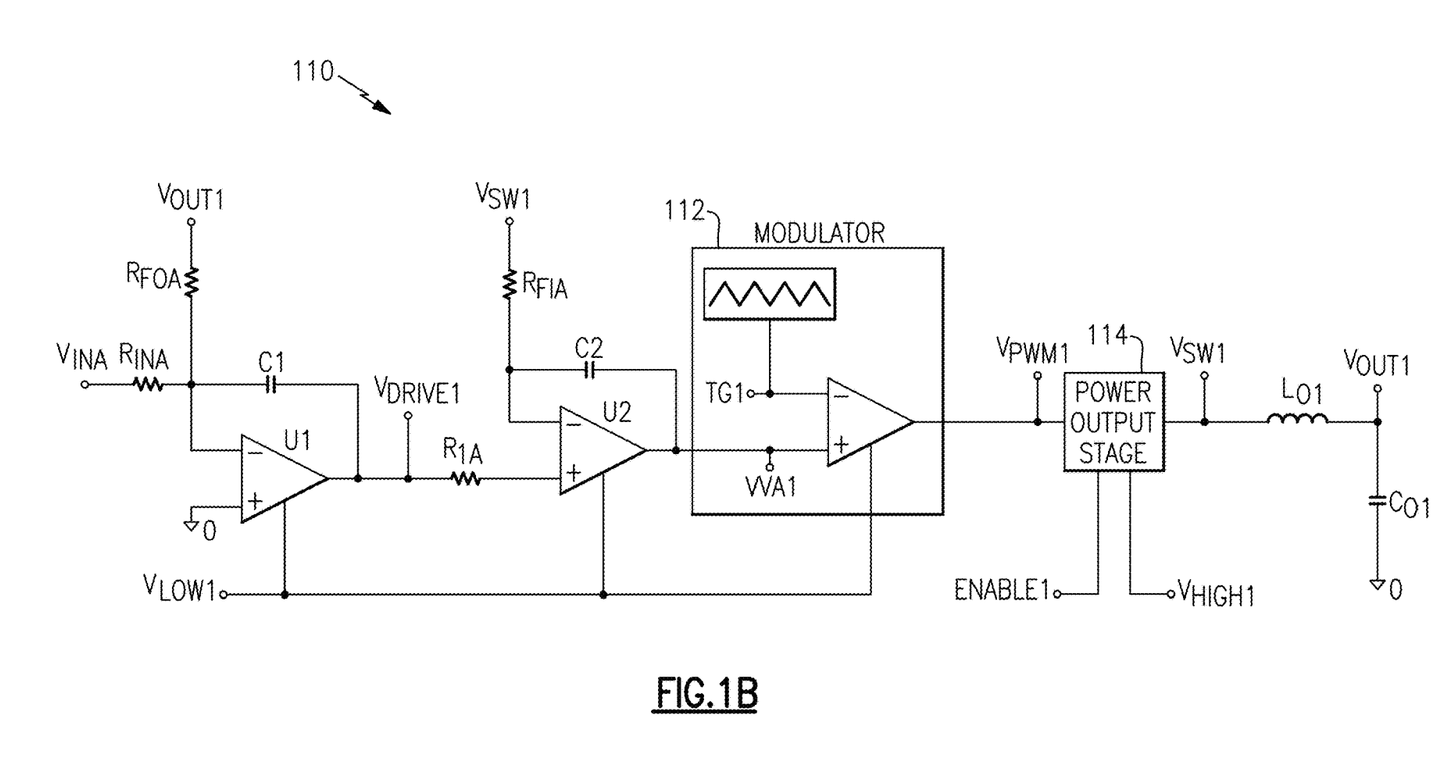
FIG. 1B illustrates an example of a class D amplifier with a control stage.

FIG. 1B illustrates an example of a class D amplifier 110 with a control stage. The class D amplifier 110 may be formed from the amplifier 100 integrated with a control system. The amplifier 110 may include a control stage or control system formed from a pair of operational amplifiers U1, U2 and associated components. Further, the control system may include a pair of integrating capacitors C1 and C2.

Following the control system, the amplifier may include a pulse width modulation (PWM) circuit 112. The output of the PWM circuit 112 may be provided to a power output stage circuit 114. The output signal may be filtered using an output filter, such as an LC filter formed from the inductor Lo1 and the capacitor Co1. The power output stage circuit 114 may be formed from the transistors 102 and 104 of the simplified class D amplifier 100. Thus, in some implementations, the circuit 114 and the output filter formed from the inductor Lo1 and the capacitor Co1 in the amplifier 110 may be replaced by the amplifier 100.

The control system may be powered by a relatively low voltage power supply Vlow. The Vlow voltage may be used to power the operational amplifiers U1, U2 of the control system. Further, the Vlow voltage may be used to power the operational amplifier or comparator of the PWM circuit 112. While the power output stage circuit 114 may be powered by a relatively high voltage supply Vhigh. In some cases, the Vlow voltage may be 5 volts or approximately 5 volts and the Vhigh voltage may be 100 volts or approximately 100 volts. It should be understood that the present disclosure is not limited as such and that other voltages may be applied to the Vlow and Vhigh inputs. However, typically the Vhigh voltage may be several times the magnitude of the Vlow voltage. For instance, the Vhigh voltage may be 10, 15, 20, or 25 times the Vlow voltage.

Figure 1C:
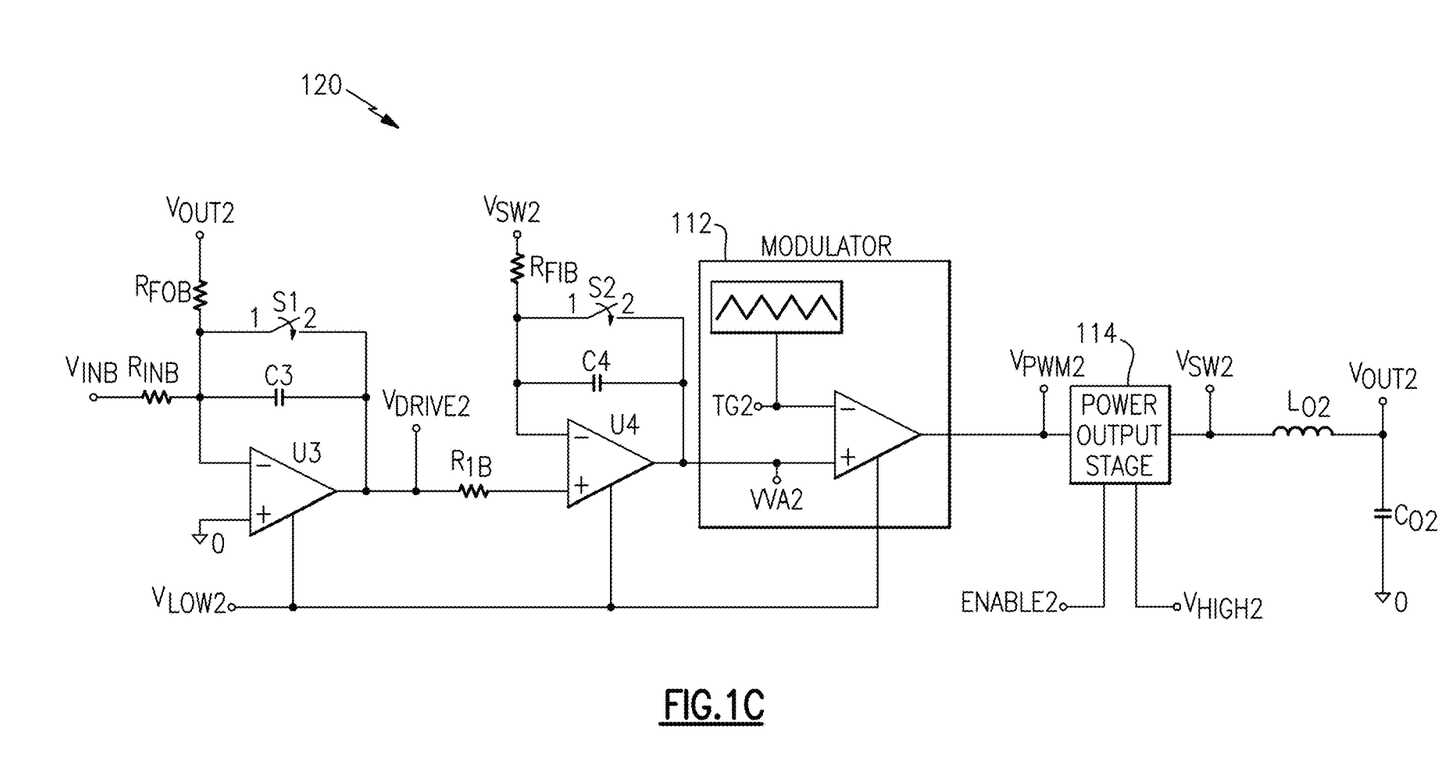
FIG. 1C illustrates an example of a class D amplifier with clamped integrating capacitors in the control stage.

FIG. 1C illustrates an example of a class D amplifier 120 with clamped integrating capacitors in the control stage. The amplifier 120 can include similar features as the amplifier 110. However, the integrating capacitors C3, C4 (which may corresponds to the capacitors C1 and C2 of the amplifier 110) may have a clamp or bypass path controlled by a pair of switches S1, S2. The switches S1, S2 may establish a 0V at a non-inverting input VVA2 to the PWM circuit 112, producing a duty cycle D=50% at Vpwm2, when the switches S1 and S2 are closed.

Figure 2:
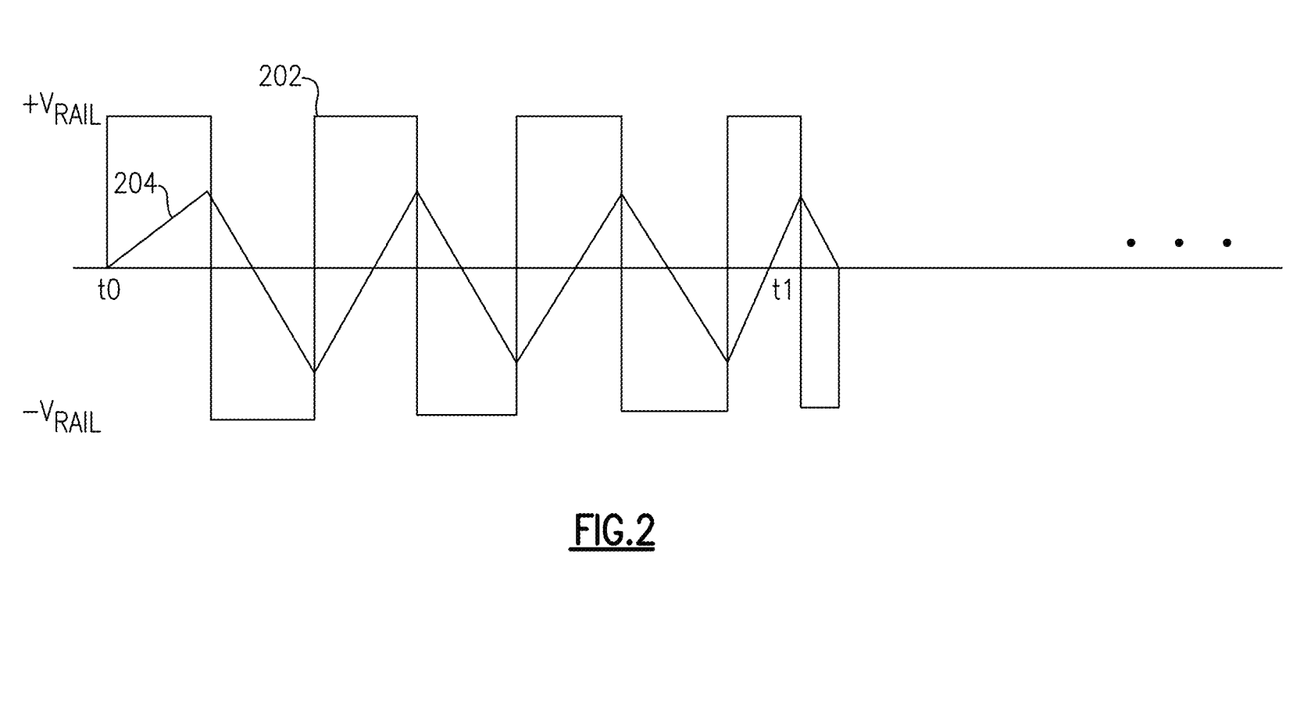
FIG. 2 illustrates a graph of the switch voltage for the class D amplifier of FIG. 1A and an inductor current of the output filter for the example class D amplifier of FIG. 1A.

FIG. 2 illustrates a graph depicting operation of the amplifier 100 of FIG. 1A. The graph depicts the switch voltage 202 (e.g., Vswitch) for the class D amplifier 100 of FIG. 1A and an inductor current 204 (e.g., $I_L$) of the output filter for the example class D amplifier 100 of FIG. 1A. At time t0, the switches 102 and 104 are enabled and the switch voltage 202 switches, over time, between +Vrail and −Vrail. Further, with the switches 102 and 104 enabled, a closed loop is formed in the class D amplifier 100 and an inductor current 204 flows across the inductor 106 charging the inductor 106.

At time t1, the amplifier 100 may be deactivated or turned off causing the switches 102 and 104 to cease switching. As a result, an open loop forms and current ceases to flow. However, because there may be a charge stored on the inductor 106, the switch voltage 202 may clamp to a state defined by the instantaneous inductor current at t1 and the inductor current 204 may decay to zero in a fraction of a switching cycle. The relatively abrupt change in current compared to when the amplifier 100 is active may result in an impulse being passed to the output filter (e.g., the LC filter). This impulse is passed to the output (Vout) and may create an audible disturbance. Further, the amplifier 100 may attempt to continue operating as the charge on the inductor 106 discharges. In some such cases, the amplifier 100 may attempt to continue to maintain the switch voltage at +Vrail and/or −Vrail as the inductor current 204 is discharged. The audible disturbance may sometimes be referred to as "pops" or "clicks" and may be unpleasant and/or undesired by a listener.

At time t0, the amplifier 100 may immediately begin switching with the switch voltage switching between +/−Vrail. The current 204 may begin to abruptly ramp up and settle to a state shown on FIG. 2 that corresponds to the switch voltage 202. The abrupt and substantial change in current passes an impulse signal to the output filter. This impulse signal may be passed to the output as an audible disturbance.

At some time prior to t0, which may be referred to as time t−1, the amplifier controls may be powered up. At time t0, the amplifier begins switching and closed loop operation is established. The transition from open to closed loop operation may cause an audible disturbance.

Figure 3A:
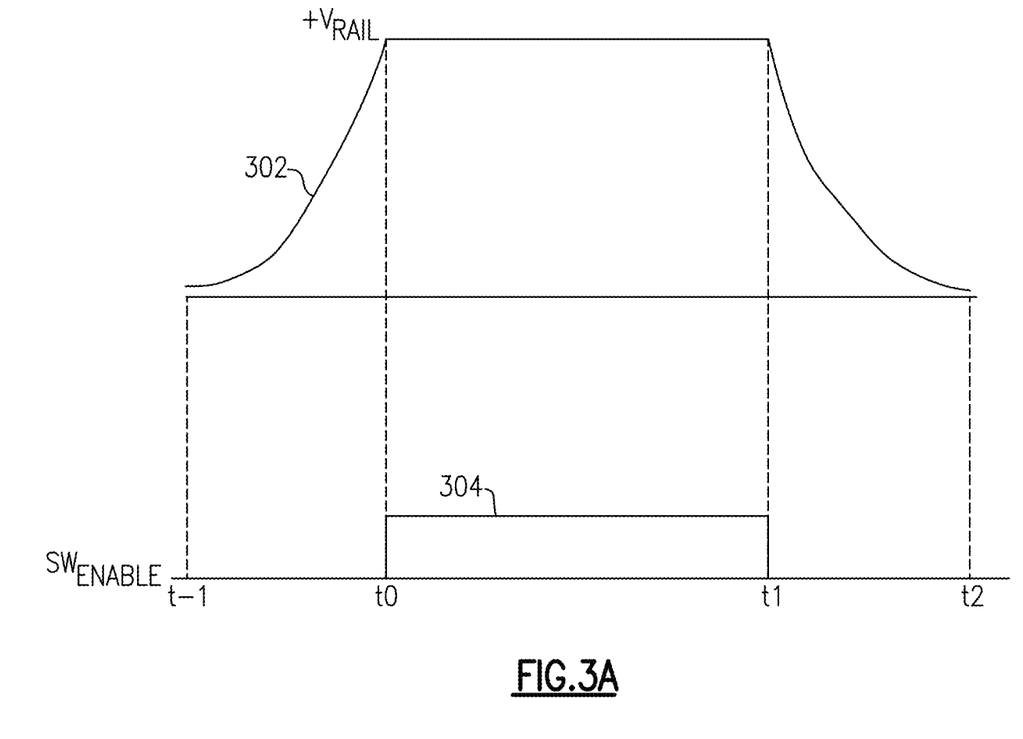
FIG. 3A illustrates a graph of supply voltage for the example class D amplifiers of FIGS. 1A-1C and an enable signal.

FIG. 3A illustrates a graph of supply voltage for the example class D amplifiers of FIGS. 1A-1C and an enable signal. As illustrated in the graph by the line 302, it may take some non-zero amount of time to charge the supply voltage to be provided to the switches of the class D amplifier. This non-zero amount of time is reflected as the time between time t−1 and t0. During this time between t−1 and t0, a switch enable signal used to enable the switches 102 and 104 of the amplifier 100 remains low or logic low. Once the supply voltage is charged to +Vrail at time t0, the switch enable signal represented by the line 304 may go high or logic high. When the switch enable signal is high, the switches 102 and 104 are activated causing the voltage Vswitch to alternate between +Vrail and −Vrail. At time t1, the switch enable may drop to low causing the switches 102 and 104 to deactivate. At this time, the supply voltage provided to the amplifier 100 may drop to 0 volts at time t2. During the time periods consisting of t−1 to t0 and t1 to t2, impulse related errors resulting from output filter settling may occur. At time t0, duty-cycle settling errors may also occur. Thus, there are two errors that may cause audible disturbances at time t0. The first error may relate to an impulse signal being sent to the output filter, which may consist of the inductor 106 and capacitor 108), as a result of the immediate application of a high voltage (e.g., Vrail) when the switch is activated. The second error may relate to pulse width modulation errors that are passed from a pulse width modulator (not shown) of the amplifier 100 to the switch circuit, which may consist of the switches 102 and 104. The pulse width modulation errors may occur because the control for the amplifier 100 is not ideal and is unable to maintain the input at ground when the switch circuit is inactive.

Figure 3B:
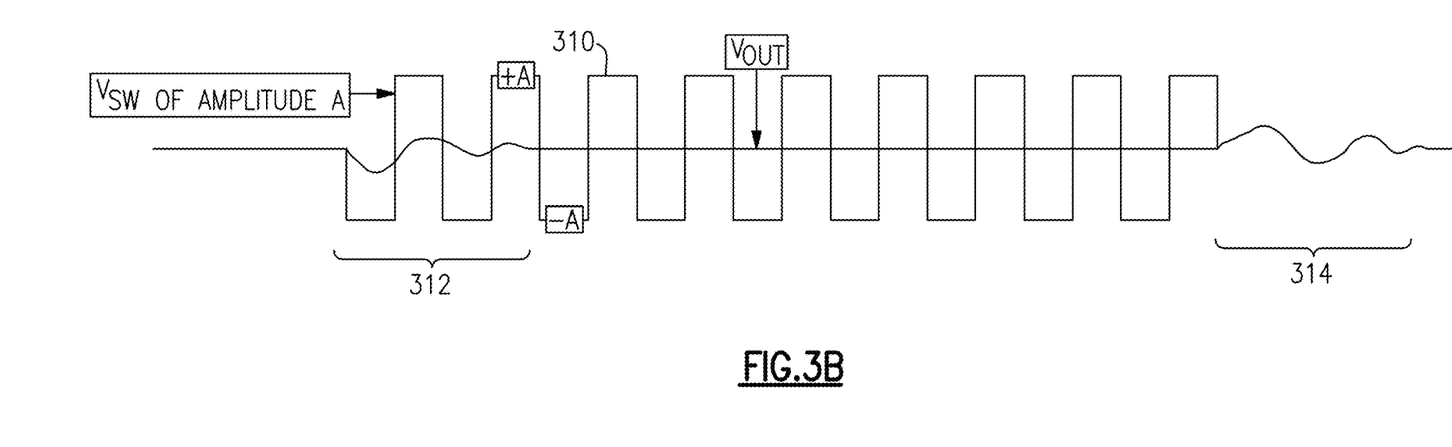
FIG. 3B illustrates a graph of the output voltage for the example class D amplifiers of FIGS. 1A-1C.

FIG. 3B illustrates a graph of the output voltage for the example class D amplifiers of FIGS. 1A-1C. The amplifiers 110, 120 at power up allow Vhigh, Vhigh2 to reach high voltage (+Vrail) before enabling switching operation of the power output stage. When the power output stage is enabled, the transient event 312 at Vout created by the onset of switching may cause an audible and, for some users, objectionable sound. A similar event 314 may occur at power down when the enable signal becomes logic low causing the switching operation of the amplifiers power output stage to end abruptly. The transient event 34 at Vout created by the cessation of switching may also create an audible and, for some users, objectionable sound.

The capacitors C3 and C4 in the amplifier 120 may be clamped, or bypassed, using the switches S1 and S2 in the amplifier 120 prior to enabling output stage switching of the power output stage 114. When clamped, Vpwm2 is held at a constant 50% duty cycle prior to enabling output stage switching of the power output stage 114. The PWM phase discontinuity created when the clamp is released, or when the switches S1 and S2 are opened, or feedback is established, may create an audible and, for some users, objectionable disturbance or noise.

In each of the amplifiers, the control system may start functioning when the Vlow input is applied. As previously described, the control system may include the operational amplifiers U1, U2 (for amplifier 110) or U3, U4 (for amplifier 120) and the capacitors C1, C2, (for amplifier 110) or C3, C4 (for amplifier 120).

Figures 3C, 3D:
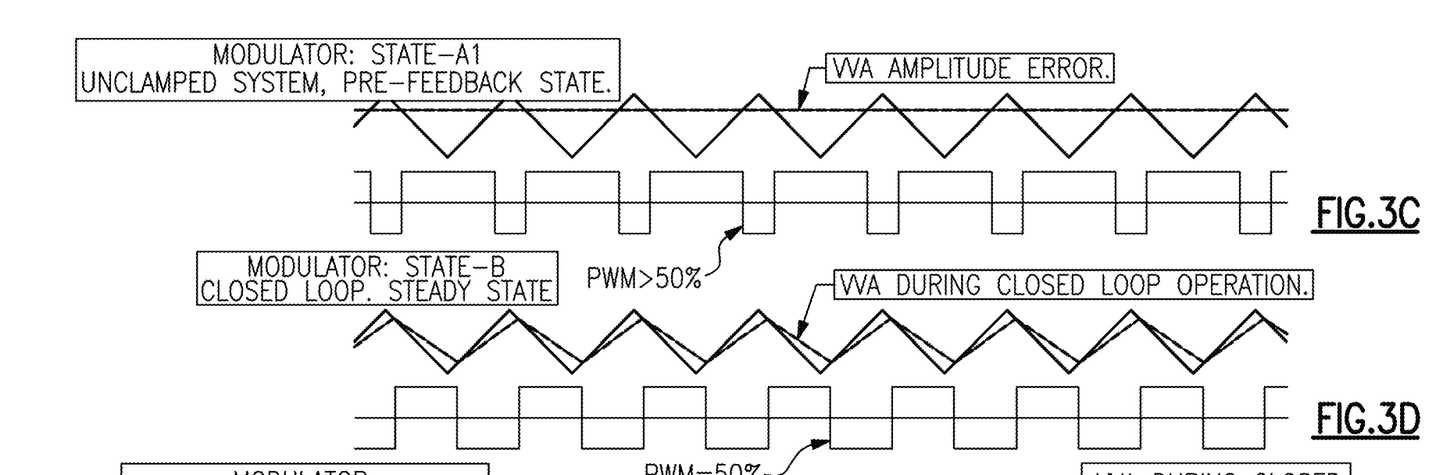
FIGS. 3C, 3D, and 3E illustrate graphs of the operation of a class D amplifier of FIG. 1B without the capability of clamping the integrating capacitors.
Figure 3E:
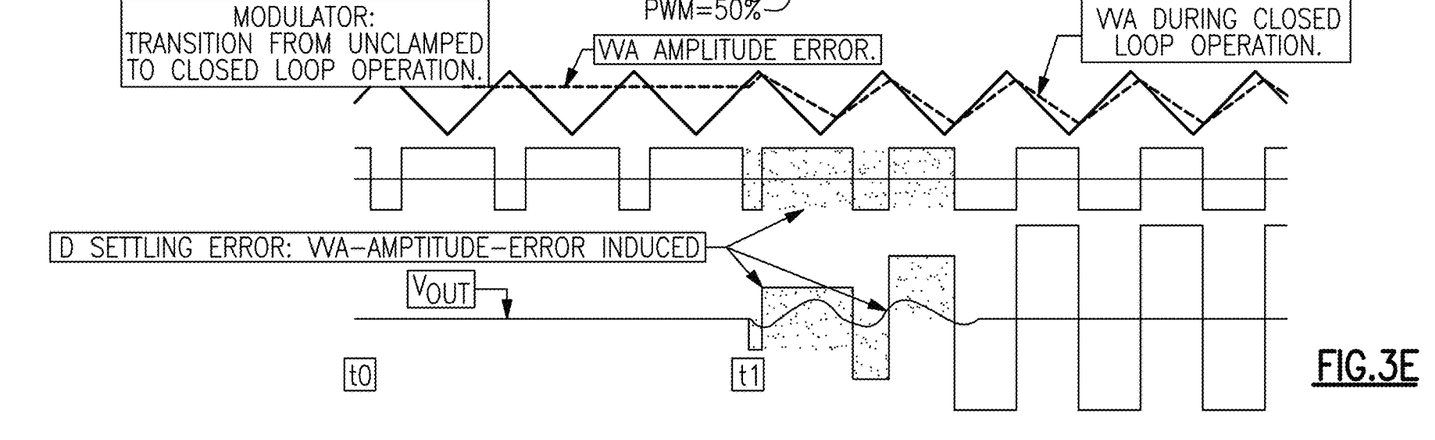

FIGS. 3C, 3D, and 3E illustrate operation of a class D amplifier 110 of FIG. 1B without the capability of clamping the integrating capacitors. If the power output stage 114 is not enabled, there will be no feedback and the integrating capacitors C1 and C2 will begin charging. The PWM circuit 112 will establish an operating point where the duty cycle, D, is not at 50% (D≠50% operating point). Thus, as illustrated in FIG. 3C, there is an amplitude error introduced by the output of the control system, which is fed to the PWM circuit 112. Further, as illustrated in FIG. 3C, the amplitude error may cause the PWM output to be greater than 50% in the pre-feedback state.

When the PWM circuitry 112 enters steady state, as illustrated in FIG. 3D, the PWM output reaches 50% duty cycle. As illustrated in FIG. 3E, there is some non-zero, non-negligible time, where the PWM circuit 112 transitions between the first state where the amplifier 110 is activated, and the second state, where the amplifier 110 reaches steady state. There is an induced amplitude error during this transition time and a duty cycle settling error that occurs as indicated in FIG. 3E. These errors during the transition may cause undesirable noise in the output of the amplifier 110.

Figure 3F:
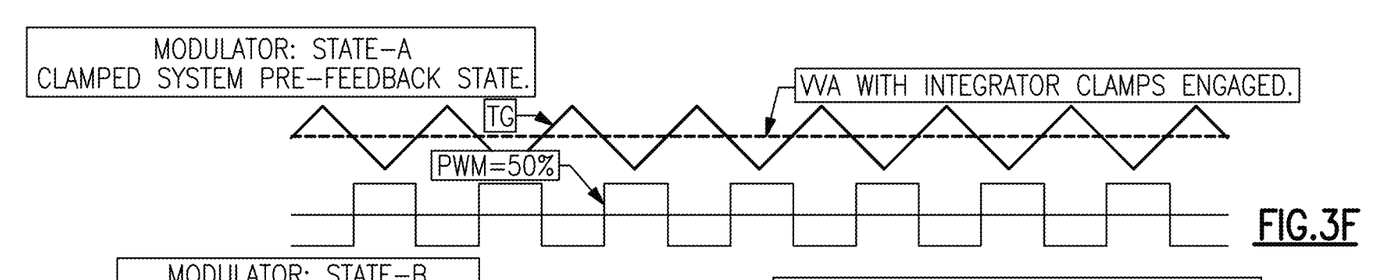
FIGS. 3F, 3G, and 3H illustrate graphs of the operation of a class D amplifier of FIG. 1C with the capability of clamping the integrating capacitors.
Figures 3G, 3H:
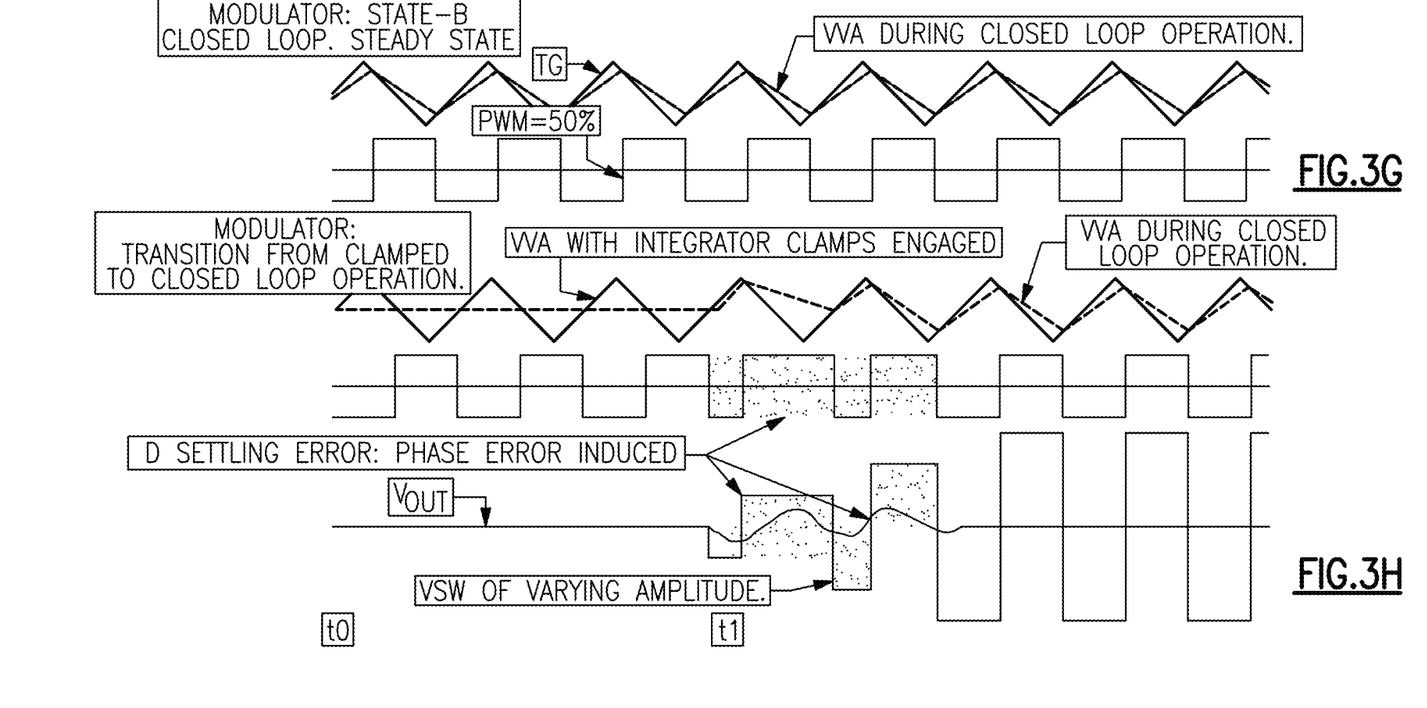

FIGS. 3F, 3G, and 3H illustrate operation of a class D amplifier 120 of FIG. 1C with the capability of clamping the integrating capacitors. With respect to the amplifier 120, the integrating capacitors C3 and C4 may be clamped by closing the switches S1 and S2. By clamping the integrating capacitors, the capacitors are prevented from charging up, and the PWM circuit 112 is able to establish a 50% duty cycle operating point. However, the phase of the PWM circuit 112 output may be misaligned with the power output stage 114.

FIG. 3F illustrate that clamping the integrating capacitors C3 and C4 during a pre-feedback or initial stage, the amplitude error of the control circuit output or PWM circuitry 112 input is reduced or eliminated, and the PWM duty cycle is at 50%. When the PWM circuitry 112 enters steady state, as illustrated in FIG. 3G, the PWM output maintains a 50% duty cycle. However, there is a phase difference between the two states. FIG. 3H illustrates a transition period where the phase of the PWM output in the pre-feedback state transitions to the steady state. There is a settling error that induces a phase error during the transition period. These errors during the transition may cause undesirable noise in the output of the amplifier 120. Thus, with either the amplifier 110 or the amplifier 120, a power up disturbance may occur after switching of the amplifier starts as the circuit settles to the steady state existing during closed loop operation.

Aspects disclosed herein eliminate the audible disturbances that may occur when the class D amplifier is activated and deactivated. An audio or power amplifier is disclosed herein that uses a feedback circuit to maintain a closed loop when the switch transistors are deactivated, enabling the charge of the inductor of the power amplifier to dissipate without causing an audible disturbance. Further, in certain implementations, the power amplifier may remain in an enable state by extending the switch enable signal to a time period when the supply voltage is charging or dissipating regardless of whether an audio input signal is received. Thus, for example with reference to FIG. 3A, the switch enable signals 304 may be extended to be high from time t−1 to time t2 instead of only being high between time t0 and t1.

In certain aspects, the control system and power output stage are active and enabled at power up of the audio amplifier as the supply voltage supplied to Vhigh ramps up from zero to full voltage, or to the designated maximum voltage for the amplifier, or to a particular selected voltage level. Similarly, the control system and power output stage may be active and enabled when the amplifier is being powered down as the supply voltage supplied to Vhigh ramps from full voltage to zero. Since switching of the transistors of the power output stage may start with a zero rail voltage and continue with the control circuit phase locked, and may stop at a point where zero rail voltage is applied, the transient events may be less or not audible and, consequently, less objectionable.

Figure 4:
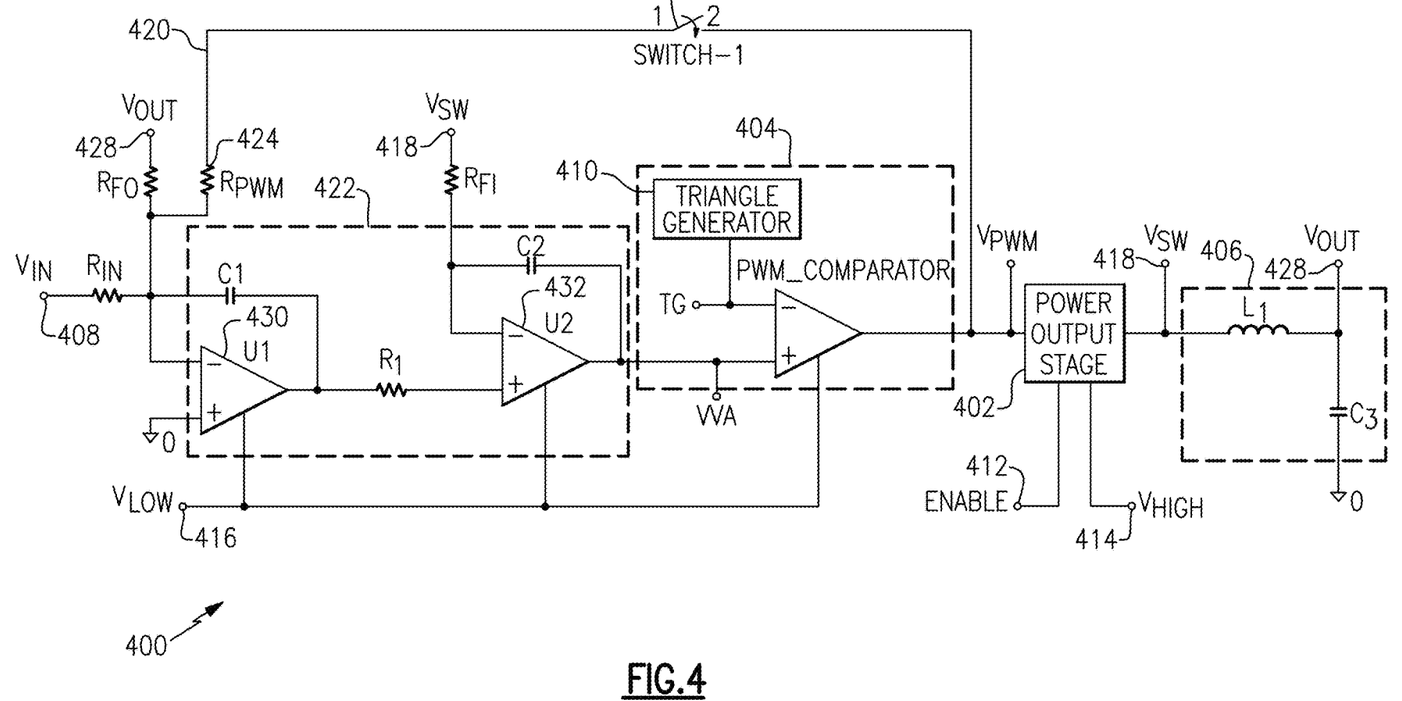
FIG. 4 illustrates an example of an audio amplifier in accordance with certain aspects.

FIG. 4 illustrates an example of an audio amplifier 400 in accordance with certain aspects. The audio amplifier 400 may be a class D amplifier that includes a pair of transistor switches. The class D amplifier may be an audio amplifier. Further, the class D amplifier may include a power output stage 402 that includes a pair of transistors configured similarly to the transistors 102 and 104 of the amplifier 100. The power output stage 402 may receive a signal from a pulse width modulator 404. This pulse width modulator 404 outputs a pulse width modulation (PWM) signal that corresponds to the audio signal received at the input port 408, which may be provided to the inverting input of the operational amplifier 430. The PWM signal may be formed by comparing the input signal to a sawtooth waveform generated by the triangle generator 410. The generated PWM signal may be used to drive the power output stage 402 to create an amplified signal. This amplified signal may be provided to the filter 406, which may filter the PWM carrier frequency to obtain the amplified audio signal.

The filter 406 may be an LC type filter that includes an inductor L1 and a capacitor C3. When the power output stage 402 is active, a current may flow across the LC filter causing a charge to be stored on one or more of the inductor L1 and the capacitor C3.

The power output stage 402 may include an enable input 412 that activates the switches of the power output stage 402. When a signal supplied to the enable input 412 is high, the switches may alternate between a closed and an open state causing the output voltage of the power output stage 402 to alternate between +Vrail and −Vrail. The voltage Vrail may match a voltage supplied to the input pin Vhigh 414.

In some implementations, the enable input 412 triggers or activates the power output stage 402. The enable input 412 may receive an enable signal (e.g., a high signal or any other signal configured to activate the power output stage 402) regardless of whether an input audio signal is received at the input pin 408. For example, the enable input 412 may activate the power output stage 402 in preparation for an audio input signal prior to receipt of an audio input signal or regardless of whether the audio input signal is provided. At substantially the same time as the enable input 412 receiving the enable signal, a supply or rail voltage signal may be supplied to the Vhigh pin 414. At approximately the same time, or a short time before, a Vlow signal is applied at the Vlow pin 416 enabling the pulse width modulator 404 and the control system 422, which controls the pulse width modulator 404, to settle into a steady state. In some cases, the enable input 412 may remain active prior to application of the rail voltage and/or when the rail voltage signal ceases to be provided to the Vhigh pin 414. The Vhigh signal applied to the Vhigh pin 414 is typically the rail voltage or a power supply voltage. In some cases, the rail voltage may be one of a plurality of available rail voltages supplied by a power supply.

Typically, existing audio amplifiers receive the full rail voltage, or no voltage. In some cases, the switch between full rail voltage and no voltage may cause an audible disturbance. Aspects of the amplifier 400 may supply the full rail voltage and can gradually remove, or decrease, the applied voltage to the Vhigh pin 414 reducing or eliminating the audible disturbance. Additionally, in some implementations, the enable signal supplied to the enable input 412 may be active or high for at least a period of time in advance of the audio amplifier 400 receiving the audio input signal. For example, the enable input 412 may receive a signal to activate the power output stage 402 while the voltage supplied to the Vhigh pin 414 is charging up to the Vrail value. Advantageously, in certain implementations, the extending of the time period during which the enable signal is active, or is supplied to the enable input 412, to include time both before and after receipt of the Vrail voltage can reduce or eliminate the audible disturbance that may occur when the audio amplifier 400 is activated or deactivated. This extended period of time during which the enable input 412 receives an enable signal may encompass both a period of time when the voltage to be applied to the audio amplifier 400 (e.g., at the Vhigh pin 414) begins to charge up to Vrail and a period of time when the supplied voltage begins to dissipate from Vrail towards ground.

Further, the audio amplifier 400 includes a feedback path 420 between the pulse width modulator 404 and the power output stage 402 that feeds back an output of the PWM 404 to a control input of the control system 422 for the power amplifier 400. This feedback path 420 does not exist in existing amplifier designs, and is not included as part of the amplifier 100. The control system 422 may establish a PWM duty-cycle and a phase state that is substantially equivalent to the PWM duty-cycle and a phase state that exists when a feedback path containing Vswitch 418 and a feedback path containing Vout 428 are closed. The feedback of the amplifier output received at the Vout 428 may be supplied to the inverting input of the operational amplifier 430 of the control system 422. Similarly, the output of the power output stage 402 may feedback to the inverting input of the operational amplifier 432 of the control system 422. When the enable pin 412 receives the enable signal and the power output stage becomes active, the Vswitch 418 may take on the state of the PWM signal generated by the PWM 404, and may settle to its final closed loop state.

The feedback path 420 enables the control system 422 to operate with feedback prior to the power output stage 402 being enabled and without charging integrating capacitors C1 and C2 of the control system 422. In some implementations, the integrating capacitors C1 and C2 are separate from the control system 422. The integrating capacitors C1 and C2 may integrate error that may exist prior to the power output stage 402 being active. When the power output stage 402 is inactive, the input pin 408 is held to ground. However, there is typically some voltage that occurs between the inverting and non-inverting inputs of the operational amplifier 430 of the control system 422 and thus the input may not be exactly at 0 volts. The voltage at the input may be relatively small (e.g., 1 mV). Nevertheless, the integrating capacitors C1 and C2 may cause the error to quickly ramp up.

Without the feedback path 420, when the power output stage 402 is inactive, an open loop exists and any small error or charge may cause the integrating capacitors C1 and C2 to charge up. Thus, when the power output stage 402 is activated forming a closed loop, a large error may initially exist. The power amplifier 400 will attempt to correct for the large error causing an additional audible disturbance until a steady state is reached. By including the feedback path 420 during power-up and power-down of the PWM 402, stability of the amplifier 400 can be improved. For example, a closed loop can be maintained, thereby preventing the integrating capacitors C1 and C2 from charging up or causing the error to ramp up. The feedback loop 420 may maintain the capacitors C1 and C2 in a defined state that may be substantially equivalent to the state existing when the power output stage 402 is active. Accordingly, in certain implementations, when the power output stage 402 is enabled, the amplifier 400 does not need to correct a large error and a steady state can more easily be reached reducing the occurrence of audible disturbance compared to existing audio amplifiers that do not implement the features disclosed herein.

The feedback path 420 may include a resistor 424 and a switch 426. In some implementations, the resistor 424 may be replaced by an impedance element or an impedance circuit. This impedance element may be a reactive element, a reactive circuit, or a frequency dependent impedance element or circuit. The switch 426 may be closed when the power output stage 402 is not enabled. By closing the switch 426, the resistor 426 may establish a PWM duty cycle and phase state that matches, or substantially matches, the PWM duty cycle and phase state of the amplifier 400 when the power output stage 402 is active. By matching the PWM duty cycle and phase state to the duty cycle and phase state that occurs when the power output stage 402 is active, the audible disturbance that occurs in existing audio amplifiers may be reduced or eliminated. When the power output stage 402 is activated, the switch 426 may be opened reducing the impact of impedance on the feedback path on the audio amplifier 400. In some implementations, the switch 426 may be optional or omitted. For example, if the resistor 424 is a relatively large resistor (e.g., 50 kΩ, 100 kΩ, or more), the amount of feedback may be relatively low due to the high amount of impedance. In some such cases, the feedback path may be maintained regardless of whether the power output stage 402 is active and thus, the switch 426 may be omitted. In cases where the resistor 424 is relatively small (e.g., 10 kΩ, 1 kΩ, or less), the amount of feedback may be relatively high due to the low amount of impedance. In some such cases, it may be desirable to remove the feedback path when the power output stage 402 is enabled by opening the switch 426.

Figure 5A:
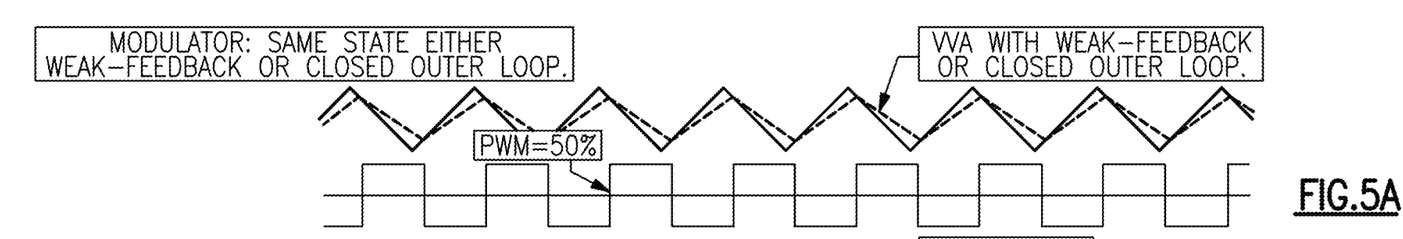
FIGS. 5A, 5B, and 5C illustrate graphs of the operation of a class D amplifier of FIG. 4 that includes a feedback loop in accordance with certain aspects.
Figure 5B:
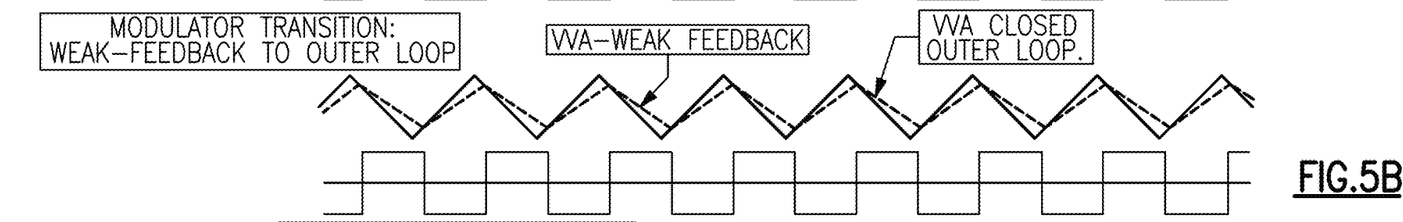
Figure 5C:
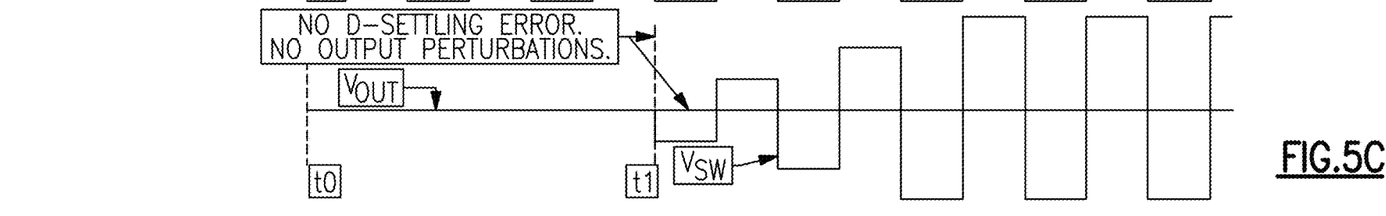

FIGS. 5A, 5B, and 5C illustrate graphs of the operation of a class D amplifier 400 of FIG. 4 that includes a feedback loop in accordance with certain aspects. The addition of the large resistor 424 and the switch 426 allows the control system to operate with feedback before the power output stage is enabled. This feedback can be used to prevent the integrating capacitors C1, C2 from charging and can be used to maintain PWM phase continuity of the PWM circuit 404 throughout ramp-up. Further, the switch 426 may be active during power up and power down to improve stability.

As illustrated in FIG. 5A, the state of the VVA voltage supplied to the PWM circuit 404 and the output of the PWM circuit has a steady amplitude and a PWM duty cycle of 50%. Thus, there is no change in amplitude or phase during a transition period, as illustrated in FIG. 5B. Accordingly, as illustrated in FIG. 5C, there is no duty cycle settling error or output perturbations introduced and thus, the audible noise during power-on and power-off can be reduced or eliminated compared to other amplifiers, such as the amplifiers 110 and 120.

Figure 6:
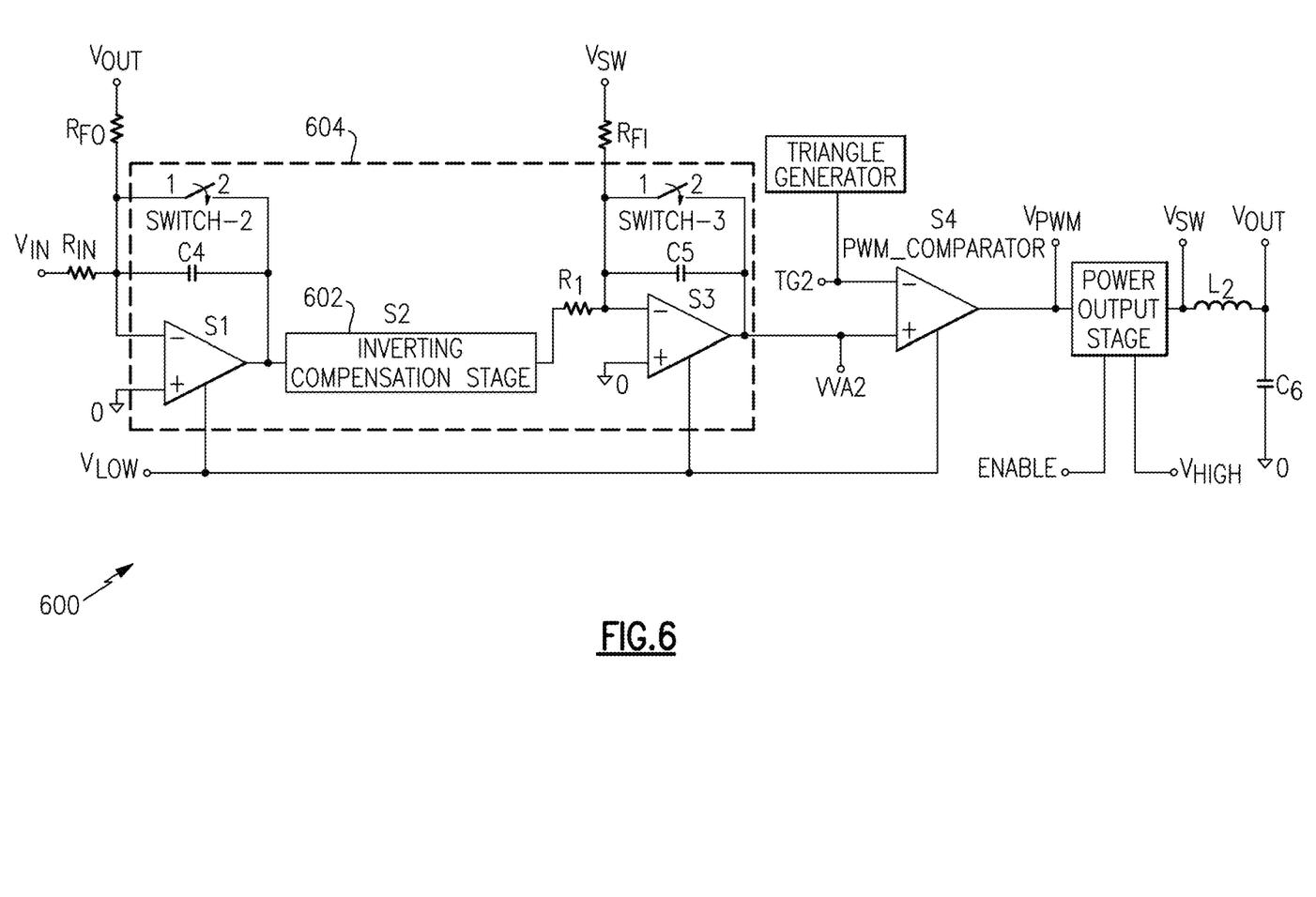
FIG. 6 illustrates an alternative example of an audio amplifier in accordance with certain aspects.

FIG. 6 illustrates an alternative example of an audio amplifier 600 in accordance with certain aspects. With the amplifier 600, a clamp switch is positioned above each of the integrating capacitors. Although the clamp switch may, in some cases, help reduce audible disturbances at power-up and power-down, the amplifier 600 is less desirable than the amplifier 400 because the use of the clamp switches may result in a PWM phase shift error. Advantageously, the use of the feedback path 420 in the amplifier 400 can eliminate audible disturbances without introducing a PWM phase shift error.

Further, the audio amplifier 600 may include an inverting compensation stage 602. The inverting compensation stage 602 may be used to invert the output of the first operational amplifier S1 of the control circuit 604 enabling the output to be provided to the inverting input of the second operational amplifier S2 of the control circuit 604. Advantageously, using the inverter S2, or the inverting compensation stage 602, enables the use of the operational amplifier S3 in inverting form. By using the operational amplifier S3 in inverting form, the common mode input voltage may be reduced.

TERMINOLOGY

It is to be understood that not necessarily all objects or advantages may be achieved in accordance with any particular aspect or embodiment described herein. Thus, for example, those skilled in the art will recognize that certain aspects or embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of aspects or embodiments of the inventions are not intended to be exhaustive or to limit the inventions to the precise form disclosed above. While specific aspects and embodiments of, and examples for, the inventions are described above for illustrative purposes, various equivalent modifications are possible within the scope of the inventions, as those skilled in the relevant art will recognize. For example, while processes or blocks are presented in a given order, alternative aspects or embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various aspects and embodiments described above can be combined to provide further aspects and embodiments.

Conditional language used herein, such as, among others, "can," "might," "may," "e.g.," and the like, unless specifically stated otherwise, or otherwise understood within the context as used, is generally intended to convey that certain aspects or embodiments include, while other aspects or embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain aspects or embodiments of the inventions have been described, these aspects or embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An audio amplifier comprising:
   a power output stage comprising a pair of transistor switches, the power output stage configured to amplify a pulse width modulation signal;
   a low pass filter configured to filter a carrier signal from the amplified pulse width modulation signal;
   a pulse width modulation circuit configured to generate the pulse width modulation signal, wherein the pulse width modulation signal corresponds to an audio input signal; and
   a feedback path including an impedance connected between the pulse width modulation circuit and a control circuit of the audio amplifier, and wherein the feedback path further includes a switch that is closed when the power output stage is inactive and open when the power output stage is active.

2. The audio amplifier of claim 1, further comprising the control circuit, wherein the control circuit is configured to provide the audio input signal to the pulse width modulation circuit.

3. The audio amplifier of claim 2, wherein the control circuit comprises an integrating capacitor.

4. The audio amplifier of claim 3, wherein the feedback path is further configured to establish a first state of the integrating capacitor when the power output stage is inactive.

5. The audio amplifier of claim 4, wherein the feedback path is further configured to establish a second state of the integrating capacitor when the power output stage is active.

6. The audio amplifier of claim 5, wherein the first state substantially matches the second state.

7. The audio amplifier of claim 1, wherein the control circuit comprises a first operational amplifier configured to receive a feedback signal from an output of the audio amplifier at an inverting input of the first operational amplifier.

8. The audio amplifier of claim 1, wherein the control circuit comprises a second operational amplifier configured to receive a feedback signal from an output of the power output stage at an inverting input of the second operational amplifier.

9. The audio amplifier of claim 1, wherein the power output stage is configured to remain active for at least a non-zero period of time after a supply voltage ceases to provide a voltage to the power output stage.

10. The audio amplifier of claim 1, wherein the pulse width modulation circuit comprises a comparator and a triangle generator, the comparator configured to compare an output of the control circuit to an output of the triangle generator.

11. The audio amplifier of claim 1, further comprising an inverting compensation circuit between a first operational amplifier of the control circuit and a second operational amplifier of the control circuit.

12. The audio amplifier of claim 1, wherein the pulse width modulation signal is generated based at least in part on the audio input signal.

13. An audio amplifier system comprising:
a power supply configured to power one or more elements of the audio amplifier system; and
an audio amplifier configured to receive power from the power supply and an audio input signal from an audio source, the audio amplifier comprising:
   a power output stage comprising a pair of transistor switches, the power output stage configured to amplify a pulse width modulation signal;
   a low pass filter configured to filter a carrier signal from the amplified pulse width modulation signal;
   a pulse width modulation circuit configured to generate the pulse width modulation signal, wherein the pulse width modulation signal corresponds to the audio input signal;
   a feedback path including an impedance connected between the pulse width modulation circuit and a control circuit of the audio amplifier; and
   a switch configured to remove the feedback path when the power output stage is enabled.

14. An audio amplifier system comprising:
a power supply configured to power one or more elements of the audio amplifier system; and
an audio amplifier configured to receive power from the power supply and an audio input signal from an audio source, the audio amplifier comprising:
   a power output stage comprising a pair of transistor switches, the power output stage configured to amplify a pulse width modulation signal;
   a low pass filter configured to filter a carrier signal from the amplified pulse width modulation signal;
   a pulse width modulation circuit configured to generate the pulse width modulation signal, wherein the pulse width modulation signal corresponds to the audio input signal; and
   a feedback path including an impedance connected between the pulse width modulation circuit and a control circuit of the audio amplifier, wherein the control circuit comprises an integrating capacitor, and the feedback path is further configured to cause the integrating capacitor to enter a first state when the power output stage is inactive and to enter a second state when the power output is active.

15. The audio amplifier system of claim 14, wherein the first state and the second state are substantially equal.

16. The audio amplifier system of claim 13, wherein the control circuit comprises:
a first operational amplifier configured to receive a feedback signal from an output of the audio amplifier at an inverting input of the first operational amplifier; and
a second operational amplifier configured to receive a feedback signal from an output of the power output stage at an inverting input of the second operational amplifier.

17. The audio amplifier system of claim 13, wherein the power output stage is configured to remain active for a particular time period after a supply voltage ceases to provide a voltage to the power output stage.

18. The audio amplifier system of claim 13, wherein the audio amplifier further comprises an inverting compensation circuit between a first operational amplifier of the control circuit and a second operational amplifier of the control circuit.

19. The audio amplifier system of claim 14, wherein the audio amplifier further comprises a switch within the feedback path that is configured to open the feedback path when the power output stage is enabled.

20. The audio amplifier system of claim 14, wherein the control circuit comprises:
a first operational amplifier configured to receive a feedback signal from an output of the audio amplifier at an inverting input of the first operational amplifier; and
a second operational amplifier configured to receive a feedback signal from an output of the power output stage at an inverting input of the second operational amplifier.

* * * * *